United States Patent [19]

Walter et al.

[11] Patent Number: 5,038,645

[45] Date of Patent: Aug. 13, 1991

[54] WEAR RESISTANT CUTTING TOOLS AND SHAPING METHOD

[75] Inventors: John L. Walter, Ballston Lake; David W. Skelly, Burnt Hills; William P. Minnear; William R. Reed, Jr., both of Schenectady, all of N.Y.

[73] Assignee: General Electric Company, Schenectady, N.Y.

[21] Appl. No.: 539,951

[22] Filed: Jun. 18, 1990

[51] Int. Cl.$^5$ .......................... B23B 3/00; B23P 15/28
[52] U.S. Cl. ...................................... 82/1.11; 82/173; 407/119
[58] Field of Search ................ 82/1.11, 173; 407/119; 408/144

[56] References Cited

U.S. PATENT DOCUMENTS

| | | | |
|---|---|---|---|
| 4,411,566 | 10/1983 | Lee et al. | 407/119 |
| 4,720,216 | 1/1988 | Smith | 407/113 |
| 4,818,153 | 4/1989 | Strandell et al. | 407/113 |
| 4,826,365 | 5/1989 | White | 408/144 |

*Primary Examiner*—Larry I. Schwartz
*Assistant Examiner*—Julie R. Daulton

*Attorney, Agent, or Firm*—James E. McGinness; James C. Davis, Jr.; James Magee, Jr.

[57] ABSTRACT

Wear resistant cutting tools are comprised of cutting tools implanted with at least one element selected from the group consisting of, chlorine, fluorine, bromine, iodine, sulfur, indium, gallium and tin. The elements are implanted within the cutting tools in at least an effective amount to increase the wear resistance of the insert, up to an amount that does not substantially impair the hot hardness and toughness of the tool.

In a method for lubricating the interface between a cutting tool and a workpiece in a lathe turning operation, at least one element selected from the group consisting of fluorine, bromine, iodine, sulfur, indium, gallium and tin are implanted in the tool. The elements are implanted so that the elements can lubricate the interface between the cutting edge and workpiece during turning without substantially impairing the hot hardness and toughness of the cutting tool. A workpiece is then shaped with the tool by metal removal, within a range of cutting speeds that cause the implanted element or elements to lubricate the interface.

9 Claims, 1 Drawing Sheet

WEAR RESISTANT CUTTING TOOLS AND SHAPING METHOD

The present invention relates to cutting tools used in machining, and more particularly to modified tools that have improved wear resistance.

Important properties for any cutting tool material are good wear resistance, toughness, and hot hardness. Hot hardness is the ability of a cutting tool material to resist stresses and maintain hardness and cutting efficiency at elevated temperatures. A variety of tool materials including high-speed steels, powdered metal high-speed tool steels, cast cobalt-based alloys, cemented tungsten carbides, titanium carbides, coated carbides, ceramics, single crystal diamonds, polycrystalline diamond, and cubic boron nitride have been developed to improve wear resistance in cutting tools while maintaining good toughness and hot hardness. The above cutting tool materials are well known, for example, further description of the materials can be found in "Tool and Manufacturing Engineers Handbook", Fourth Edition Volume Machining, Chapter 3 Cutting Tool Materials, Society of Manufacturing Engineers, 1983. As used herein the term "cutting tool" or "cutting tools" means the cutting tools made from the cutting tool materials discussed above.

Turning is one of the most demanding of the machining processes with respect to wear of cutting tools. In turning, a workpiece is held and rotated about its longitudinal axis on a machine tool called a lathe. Cutting tools mounted on the lathe are fed into the workpiece to remove material and thus produce the required shape. The principal surfaces machined are concentric with the longitudinal axis of the workpiece.

Turning operations are performed by the removal of material from external surfaces on rotating workpieces. Related operations on external surfaces, also performed on lathes, include facing, chamfering, grooving or necking, knurling, skiving, threading, and cutoff or parting. Operations that can be performed on internal surfaces with a lathe include drilling, reaming, boring, threading, and recessing.

Cutting tools used in machining by lathe turning have at least one cutting edge that engages against and deforms the surface of a workpiece that is moving relative to the tool. Deformation of the workpiece increases until the pressure is large enough to produce a stress which separates material. The separated material glides over a surface of the tool called the rake face in the form of a chip. During cutting a repeating cycle occurs where particles of cut material adhere to the cutting edge and form a buildup that eventually is partly or entirely swept away by the chips. Along with the built up edge, parts of the cutting edge are carried off and the result of this cycle is deterioration or wear of the cutting edge by abrasion. The tool surface facing the workpiece is called the flank, and abrasion of the cutting edge also causes flank wear.

As the cutting edge wears during turning, the pressure exerted by the tool against the workpiece increases. Eventually, the cutting edge will become so worn that the pressure exerted by the tool against the workpiece can cause a deflection in the workpiece, and the accuracy of the cutting process is impaired. In addition to the premature damage of the cutting edge, the formation of buildup at the cutting edge causes chattering of the tool, and an uneven finish on the workpiece. Wear on the cutting edge is monitored and the cutting edge is changed to prevent deflection of the workpiece, chattering of the tool, or uneven finish on the workpiece. As used herein, the term "cutting life" means the length of time a cutting edge can be used in turning without causing substantial deflection of the workpiece, chattering of the tool, or uneven finish on the workpiece.

When buildup is excessive at the cutting edge, cutting speeds can be reduced to lessen the buildup, and extend the cutting life of the tool. Cutting speed is the relative speed between the workpiece and cutting edge and can be measured as the distance covered by the cutting edge, pressed against the workpiece, in the direction of cutting movement per unit of time.

Titanium alloys are among the most difficult metals to lathe turn due to properties that accelerate buildup on cutting tool edges including: a melting point 300° C. higher than most super alloys, low thermal conductivity, high chemical reactivity, and a crystal structure with a limited number of slip systems. The rake-face and cutting edge of tools used in turning titanium alloys are also subjected to cyclic thermal and mechanical fatigue due to the combination of the above properties. As a result, the tools used to machine titanium alloy substrates by lathe turning are subjected to rapid flank wear, severe rake-face cratering, and plastic deformation of the cutting edge as a result of the high temperatures developed at the cutting edge, chemical corrosion from the reactive titanium, and mechanical abrasion.

Cemented carbides are well known for their combination of hardness, strength, and wear resistance and are extensively used to make cutting tools. Cemented carbides are solid and coherent masses made by pressing and sintering a mixture of powders of one or more metallic carbides with a small amount of a binder metal selected from the group iron, nickel, and cobalt. Suitable carbides include the carbides of tungsten, titanium, tantalum, columbium, molybdenum, vanadium, chromium, zirconium, and hafnium. It is known that the wear resistance of cemented carbides can be enhanced by the application of a thin coating of a highly wear-resistant material such as titanium carbide, titanium nitride, or aluminum oxide.

A cemented carbide tool that is used for lathe turning nonferrous alloys, such as titanium alloys, is the Carboloy grade 883 insert SNG 434 F. Such inserts are clamped in tool holders for use during the turning operation. The designation SNG 434 F means the insert; is designed to be clamped in the tool holder so that the rake face has a negative angle of inclination to the workpiece, has a ground finish that is not polished, and is ½ inch square, 3/16 inch thick, with a 1/16 inch radius at each cutting edge.

A commercially available titanium alloy comprised of 6 weight percent aluminum, 4 weight percent vanadium, and the balance titanium is herein referred to as Ti-6Al-4V. The recommended cutting speed for the Carboloy grade 883 insert, when used for turning Ti-6Al-4V, is about 160 to 180 feet per minute.

Application of wear resistant coatings on carbide cutting tools has led to increases of 4 to 10 times in the cutting speeds that can be used for turning steel and superalloys, while providing comparable cutting life. However, such wear resistant coatings on cemented carbide tools have been ineffective in improving the cutting speeds that can be used for turning titanium alloys. Other advanced cutting tool materials such as cermets and ceramics have also been found to be ineffective in increasing the cutting speeds used for turning titanium alloys, and the cutting speeds for turning titanium alloys have remained below about 200 feet per minute.

In machining operations such as milling and drilling, lubricating fluids are sometimes applied to the area where the cutting tool is in contact with the workpiece. Such fluids are herein referred to as cutting fluids. Cutting fluids containing chlorine or sulfur are known to provide effective lubrication in the machining of titanium alloys by drilling and milling operations. However, the addition of chlorine or sulfur to cutting fluids has not improved the efficiency of machining titanium alloys by lathe turning. In turning, the point of the tool is buried in the workpiece so that the cutting fluid cannot lubricate the interface between the cutting edge and the workpiece. In addition, such cutting fluids leave chlorine and sulfur deposits on the substrates after the machining operation is completed. The deposits of chlorine and sulfur can cause corrosion or embrittlement of titanium alloy substrates, and the substrates must be carefully cleaned after the machining operation to remove the deposits.

It is an object of this invention to provide improved cutting tools that have increased wear resistance.

Another object is to provide improved cutting tools that provide a self-lubricating interface between the cutting edge and the workpiece.

Another object is to provide improved cutting tools that can be used at higher cutting speeds.

Another object is to provide a method for increasing the wear resistance of cutting tools.

Another object is to provide a method for lubricating the interface between a cutting tool and a workpiece in lathe turning.

We have discovered modified cutting tools that provide a lubricant at the cutting edge of the tool, so that during cutting the interface between a metal workpiece and the tool is lubricated. Because the interface between the workpiece and tool is lubricated, the wear resistance of the tool is improved. As used herein, the term "wear resistant cutting tool" means the cutting life of the tool is extended so that the tool can be used with increased cutting speeds while providing a good cutting life.

The wear resistant cutting tools are comprised of cutting tools implanted with at least one element selected from the group consisting of chlorine, fluorine, bromine, iodine, sulfur, indium, gallium, and tin. The elements are implanted within the cutting tools in at least an effective amount to increase the wear resistance of the insert, up to an amount that does not substantially impair the hot hardness and toughness of the tool. Preferably the cutting tools are implanted with one of the elements selected from the group consisting of chlorine, fluorine, bromine, iodine, sulfur, indium, gallium, and tin.

In a method for increasing the wear resistance of cutting tools, the cutting tools are implanted with at least one element selected from the group consisting of chlorine, fluorine, bromine, iodine, sulfur, indium, gallium, and tin so that the implanted element lubricates the cutting edge of the tool during a shaping operation without substantially impairing the strength and toughness of the cutting tool.

In a method for lubricating the interface between a cutting tool and a metal workpiece in a lathe turning operation, at least one element selected from the group consisting of chlorine, fluorine, bromine, iodine, sulfur, indium, gallium, and tin are implanted in the tool. The elements are implanted so that the elements can lubricate the interface between the cutting edge and the workpiece during turning without substantially impairing the hot hardness and toughness of the cutting tool. A workpiece is then shaped with the tool by metal removal, within a range of cutting speeds that cause the implanted element or elements to lubricate the interface.

DETAILED DESCRIPTION OF THE INVENTION

Figure 1:
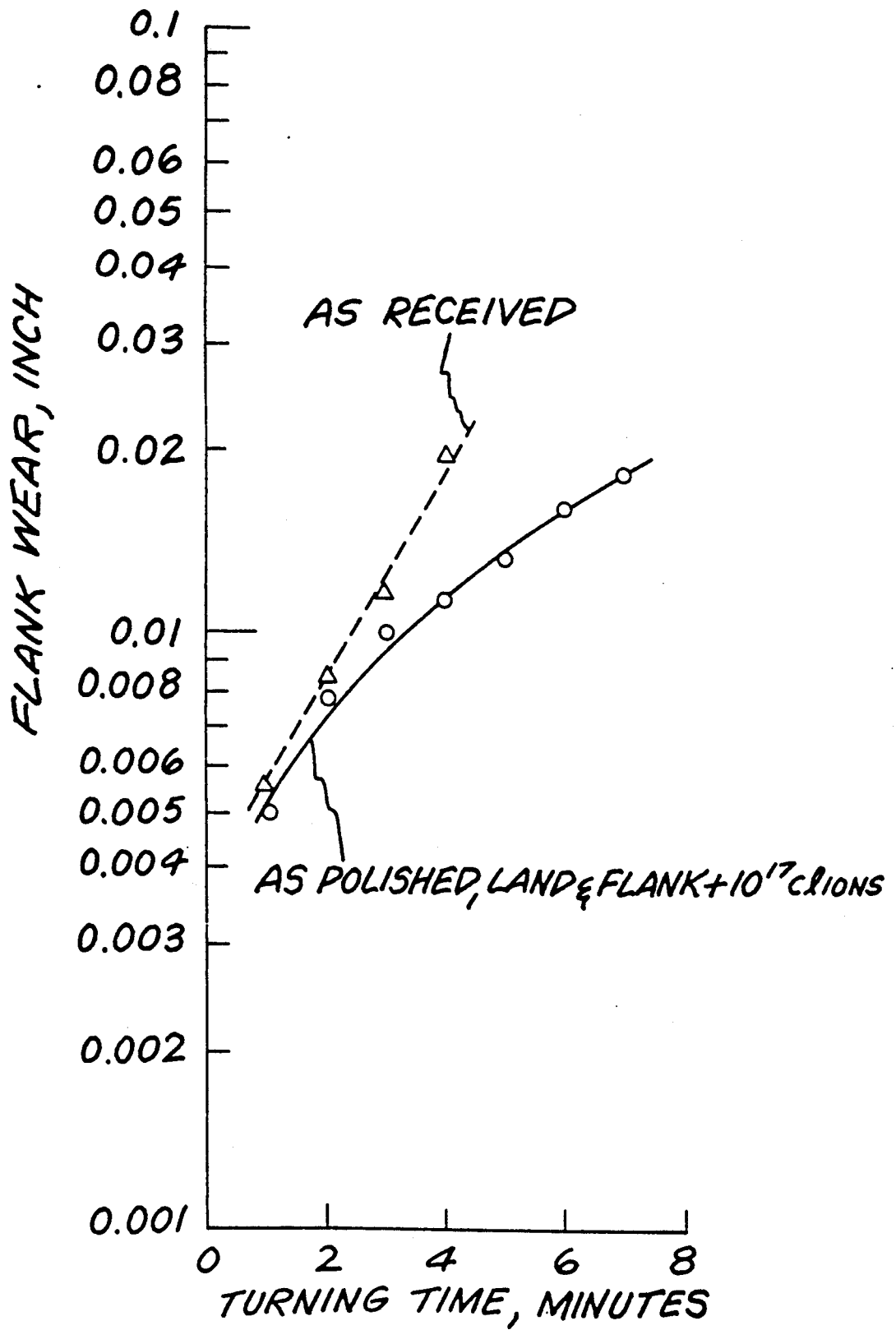
FIG. 1 is a graph comparing the wear on tungsten carbide cutting tools used to lathe turn the titanium alloy Ti-6Al-4V. An unmodified tungsten carbide tool is compared with a modified tungsten carbide tool implanted with chlorine.

The modified cutting tools and method of this invention provide a unique and efficient method for lubricating the interface between a cutting edge and a workpiece. As a result, the cutting tools and method of this invention will have a wide variety of application to various machining, shaping, or metal cutting operations such as milling, drilling, and turning, as well as application to a wide variety of cutting tools as described above. In addition, the modified cutting tools will provide increased wear resistance in machining various metal substrates such as steel, titanium, and superalloys.

Friction between the tool and the workpiece during the shaping operation causes heating and reaction of the implanted element. It is believed the elements fluorine, chlorine, bromine, iodine, and sulfur react with the substrates to form low shear films that lubricate the interface between the cutting edge of the tool and the workpiece. It is believed the elements indium, tin, and gallium melt to form a liquid lubricant at the interface during the shaping operation, because of the low melting points and relatively low vapor pressures at high temperatures for each of these elements.

The elements are implanted within the cutting tools in at least an effective amount to increase the wear resistance of the tools, up to an amount that does not substantially impair the hot hardness and toughness of the tools. For example, it has been found that up to 10 atomic percent of the elements can be added to cemented tungsten carbide tools without substantially impairing the hot hardness and toughness of the tools.

Implantation of the elements can be by a variety of means that are at least effective in implanting the elements at the cutting edges of the tool. A preferred method to implant the elements is ion implantation. For example, it has been found that up to 0.4 microns of the surface of a cemented tungsten carbide tool can be implanted with the elements using ion implantation. Frictional heating from the shaping operation causes further diffusion of the implanted elements into the tool so that the effect of the elements in increasing wear resistance extends beyond the 0.4 microns of surface initially implanted.

As discussed above, it is known that chlorine and sulfur can be added to cutting fluids to improve wear resistance in certain machining operations, but a deposit remains that can be harmful to the workpiece. It has been found that when the modified tools of this invention are used in turning, a deposit is not left as a remainder on the workpiece so that special cleaning operations are not required to remove deposits of chlorine or sulfur.

EXAMPLE 1

Cemented carbide cutting tools of Carboloy grade 883, inserts SNG 434 F were obtained. Some of the inserts were given surface treatments such as polishing on the land or flank, etching the insert in hydrochloric acid for 30 seconds, or combinations thereof. Polishing was performed on a polishing wheel using an alumina or diamond paste. Tools were then implanted with chlorine, fluorine, bromine, iodine, sulfur, indium, gallium, or tin using ion implantation. The ion implantation was performed by the Spire Corporation in Bedford, Mass. The level of ion implantation and surface treatment used on each insert are shown below in Table 1. On some samples the ion implantation beam was directed at the cutting edge, while on others it was directed at the land of the insert as shown in Table 1. The depth of ion implantation was measured by secondary ion mass spectrometry, and was found to extend up to about 0.4 microns from the surface of the insert. The highest level of implantation was about 0.025 microns from the surface at a level of about 10 atomic percent.

TABLE 1

| Tool No. | Ion Implanted | Implantation Level (Ions/cm$^2$) | Implant Area | Turning Time (Minutes) and Measured Flank Wear (inches) | | | | Tool Preparation Before Ion Implant |
|---|---|---|---|---|---|---|---|---|
| | | | | 4 | 5 | 6 | 7 | |
| 1. | None | | | .021 | | | | Polish Land, Flank, & Etch |
| 2. | Cl | 2 × 10$^{16}$ | Edge | .012 | | | | Polish Flank |
| 3. | Cl | 2 × 10$^{16}$ | Edge | .018 | | | | Polish Flank |
| 4. | Cl | 5 × 10$^{16}$ | Edge | .0119 | .019 | | | Polish Land, Flank |
| 5. | Cl | 5 × 10$^{16}$ | Land | .016 | .019 | | | Polish Land, Flank |
| 6. | Cl | 1 × 10$^{17}$ | Edge | .0098 | | | | Polish Land, Flank & Etch |
| 7. | Cl | 1 × 10$^{17}$ | Edge | .016 | | | | Polish Flank, & Etch |
| 8. | Cl | 1 × 10$^{17}$ | Edge | .0112 | .0133 | .016 | .0182 | Polish Land, Flank, & Etch |
| 9. | Cl | 5 × 10$^{17}$ | Land | .0119 | .014 | .0196 | | Polish Land, Flank |
| 10. | Cl | 5 × 10$^{17}$ | Edge | .017 | | | | Polish Land, Flank |
| 11. | F | 1 × 10$^{17}$ | Edge | .015 | .019 | | | Polish Land, Flank |
| 12. | I | 1 × 10$^{17}$ | Edge | .0098 | .012 | .018 | | Polish Land, Flank |
| 13. | B | 1 × 10$^{17}$ | Edge | .014 | .018 | | | Polish Land, Flank |
| 14. | S | 1 × 10$^{17}$ | Edge | .011 | .0182 | | | Polish Land, Flank |
| 15. | In | 1 × 10$^{17}$ | Edge | .0098 | .0119 | .0133 | .0182 | Polish Land, Flank |
| 16. | S+Cl | 1 × 10$^{17}$ | Edge | .019 | | | | Polish Land, Flank |

The inserts were then evaluated in lathe turning tests. A rod six inches in diameter and two feet long of the titanium alloy Ti-6Al-4V was machined by lathe turning with the inserts. All the turning tests were conducted using a 0.10 inch depth of cut, a 0.009 inch per revolution feed rate, with a cutting speed of 300 feet per minute. As discussed above, the recommended cutting speed for turning Ti-6Al-4V with the Carboloy insert is 160 to 180 feet per minute. A tool insert that was not implanted or surface treated was also run in the machining test as a control. The inserts were used to cut the titanium alloy for one minute intervals after which the flank wear in inches was measured, and is shown above in Table 1. In the above test, 0.02 inch flank wear was used as a measure of cutting life for when the cutting edge on the tool could no longer be used and would require changing.

By comparing the data in Table 1, it can be seen that the cutting life of the unmodified control insert was about 4 minutes, however, the inserts implanted with chlorine, fluorine, bromine, iodine, sulfur, indium, gallium, or tin had less than 0.02 inch of flank wear after 4 minutes in the turning tests. In the several instances where inserts were used for extended periods beyond 4 minutes in the turning tests, it is apparent that cutting life was essentially doubled.

This can also be seen in the graph of FIG. 1 where the rate of tool wear is shown by plotting the flank wear in inches on the ordinate as a function of turning time plotted on the abscissa. The untreated inserts have a cutting life of about 4 minutes, whereas the ion implanted inserts have a cutting life of about 8 minutes. As a result, at a cutting speed of 300 feet per minute the cutting edge on the implanted tool had about twice the cutting life of the cutting edge on the unmodified tool.

We claim:

1. A wear resistant tool having at least one cutting edge suitable for shaping a metal workpiece by metal removal, comprising; the tool having atoms of at least one element selected from the group consisting of fluorine, chlorine, bromine, iodine, sulfur, indium, tin, and gallium implanted in the tool within an effective amount to increase wear resistance of the cutting edge up to about 10 atomic percent, and within about 0.4 microns of the surface of the tool.

2. The tool of claim 1 wherein the tool is a cutting tool insert used in lathe turning.

3. The tool of claim 2 wherein the tool is a cemented carbide.

4. A process for lubricating an interface between a cutting tool edge and a metal workpiece during shaping of the workpiece by metal removal, comprising: implanting the tool with at least one element from the group consisting of fluorine, chlorine, bromine, iodine, sulfur, indium, tin, and gallium within an effective amount to increase wear resistance of the cutting edge up to about 10 atomic percent; and within about 0.4 microns of the surface of the tool.

5. The process of claim 4 where the shaping is lathe turning and the cutting tool is a cemented carbide.

6. The process of claim 5 where the workpiece is a titanium alloy.

7. A method for increasing the wear resistance of cutting tools having at least one cutting edge for shaping a metal workpiece by metal removal, comprising; implanting the tool with at least one element from the group consisting of fluorine, chlorine, bromine, iodine, sulfur, indium, tin, and gallium within an effective amount to increase wear resistance of the cutting edge up to about 10 atomic percent, and within about 0.4 microns of the surface of the tool.

8. The method of claim 7 wherein the tool is a cemented carbide and the shaping is lathe turning.

9. The method of claim 8 wherein the workpiece is a titanium alloy.

* * * * *